United States Patent
Kim et al.

(10) Patent No.: US 11,977,240 B2
(45) Date of Patent: May 7, 2024

(54) APPARATUS FOR CONTROLLING LENS MODULE AND REDUCING OFFSET OF HALL SENSOR

(71) Applicant: Samsung Electro-Mechanics Co., Ltd., Suwon-si (KR)

(72) Inventors: Ji Hwan Kim, Suwon-si (KR); Koon Shik Cho, Suwon-si (KR); Youn Joong Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 685 days.

(21) Appl. No.: 17/166,406

(22) Filed: Feb. 3, 2021

(65) Prior Publication Data
US 2022/0057646 A1     Feb. 24, 2022

(30) Foreign Application Priority Data
Aug. 18, 2020  (KR) .................. 10-2020-0103263

(51) Int. Cl.
*G01D 5/14*     (2006.01)
*G02B 27/64*    (2006.01)
*H03F 3/45*     (2006.01)
*H03M 1/12*     (2006.01)

(52) U.S. Cl.
CPC .......... *G02B 27/646* (2013.01); *G01D 5/145* (2013.01); *H03F 3/45475* (2013.01); *H03M 1/12* (2013.01)

(58) Field of Classification Search
CPC .... H03M 1/12; H03F 3/45475; G02B 27/646; G01D 5/145; G01D 5/142
See application file for complete search history.

(56) References Cited

U.S. PATENT DOCUMENTS

| 6,037,763 | A  | * | 3/2000  | Trontelj ................. | G01R 21/08 324/251 |
|---|---|---|---|---|---|
| 2009/0315575 | A1 |   | 12/2009 | Yoshioka |  |
| 2016/0290837 | A1 | * | 10/2016 | Michelutti ............... | G01D 1/10 |
| 2017/0248662 | A1 |   | 8/2017  | Santos et al. |  |
| 2019/0049528 | A1 |   | 2/2019  | Cesaretti |  |

FOREIGN PATENT DOCUMENTS

| JP | 4809472 B2 | 11/2011 |
|---|---|---|
| KR | 10-1905341 B1 | 10/2018 |

* cited by examiner

*Primary Examiner* — Patrick C Chen
(74) *Attorney, Agent, or Firm* — NSIP Law (57) ABSTRACT

An apparatus configured to reduce an offset of a Hall sensor includes a voltage-current conversion circuit and a current mirror circuit. The voltage-current conversion circuit is configured to generate a current configured to decrease when a voltage of an input terminal to which a bias current of a Hall sensor is input increases and increase when the voltage of the input terminal decreases. The current mirror circuit has a current mirror structure configured to feedback the bias current based on the current generated by the voltage-current conversion circuit.

17 Claims, 6 Drawing Sheets

APPARATUS FOR CONTROLLING LENS MODULE AND REDUCING OFFSET OF HALL SENSOR

CROSS-REFERENCE TO RELATED APPLICATION(S)

This application claims benefit under 35 USC 119(a) of priority to Korean Patent Application No. 10-2020-0103263 filed on Aug. 18, 2020 in the Korean Intellectual Property Office, the entire disclosure of which is incorporated herein by reference for all purposes.

BACKGROUND

1. Field

The present disclosure relates to an apparatus for controlling a lens module and reducing an offset of a Hall sensor.

2. Description of Related Art

In general, when a lens module moves based on a force received from an external source, a technology for fixing its position relative to the outside of the lens module is widely used.

For example, a camera module may include an optical image stabilizer device fixing the position of the lens module therein, even when the camera module is subjected to an external force.

A Hall sensor may be used to measure the position information of the lens module, and the Hall sensor may output a voltage varying depending on the position of the lens module. The accuracy of optical image stabilization may be higher as the accuracy of the corresponding relationship between the output voltage of the Hall sensor and the position information of the lens module increases.

The output voltage of the Hall sensor may vary slightly depending on external factors such as temperature, and variations in the output voltage due to external factors of the Hall sensor may degrade the accuracy of the corresponding relationship between the output voltage of the Hall sensor and the position information of the lens module.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an apparatus configured to reduce an offset of a Hall sensor includes a voltage-current conversion circuit and a current mirror circuit. The voltage-current conversion circuit is configured to generate a current configured to decrease when a voltage of an input terminal to which a bias current of a Hall sensor is input increases and increase when the voltage of the input terminal decreases. The current mirror circuit has a current mirror structure configured to feedback the bias current based on the current generated by the voltage-current conversion circuit.

The current mirror circuit may include a feedback input transistor configured to flow the current generated by the voltage-current conversion circuit between a source terminal and a drain terminal of the feedback input transistor, and a feedback output transistor configured to flow the bias current between a source terminal and a drain terminal of the feedback output transistor. The current mirror circuit may be configured to mirror the current generated by the voltage-current conversion circuit through a gate terminal of the feedback input transistor and a gate terminal of the feedback output transistor.

The voltage-current conversion circuit may include a conversion transistor configured to flow the current generated by the voltage-current conversion circuit between a drain terminal and a source terminal of the conversion transistor. The current mirror circuit may further include a feedback resistor connected between the feedback input transistor and the conversion transistor.

The feedback input transistor may include a first feedback input transistor and a second feedback input transistor connected to each other in series. The feedback output transistor may include a first feedback output transistor and a second feedback output transistor connected to each other in series. The first and second feedback input transistors may mirror the current generated by the voltage-current conversion circuit to the first and second feedback output transistors in parallel.

The feedback resistor may be connected between a gate terminal of the first feedback input transistor and a gate terminal of the second feedback input transistor.

The voltage-current conversion circuit may further include a conversion resistor connected between the conversion transistor and a ground.

The apparatus may further include a conversion operational amplifier having an output terminal connected to a gate terminal of the conversion transistor, receiving a voltage corresponding to a voltage of an input terminal of the hall sensor to one of a plurality of input terminals of the conversion operational amplifier and to a node between the conversion transistor and the conversion resistor through another one of the plurality of input terminals of the conversion operational amplifier.

The voltage-current conversion circuit may further include a buffer configured to invert the voltage of the input terminal of the hall sensor and output a voltage corresponding to the voltage of the input terminal of the hall sensor to the conversion operational amplifier.

The voltage-current conversion circuit may include a conversion transistor configured to flow the current generated by the voltage-current conversion circuit between a drain terminal and a source terminal of the conversion transistor, and a buffer configured to invert a voltage of the input terminal of the Hall sensor and output a voltage corresponding to the voltage of the input terminal of the Hall sensor. The conversion transistor may be configured to generate a current configured to increase when a voltage output from the buffer increases and decrease when a voltage output from the buffer decreases.

The buffer may include a buffer operational amplifier, a first resistor connected between one of a plurality of input terminals of the buffer operational amplifier and an input terminal of the Hall sensor, a second resistor connected between one of the plurality of input terminals of the buffer operational amplifier and an output terminal of the buffer operational amplifier, and third and fourth resistors connected to another of the plurality of input terminals of the buffer operational amplifier.

The buffer may be configured to apply a reference voltage, different from a ground voltage, to the third and fourth resistors.

In another general aspect, an apparatus configured to control a lens module includes a Hall sensor, an analog-todigital (AD) converter, a driver, a voltage-current conversion circuit, and a current mirror circuit. The Hall sensor is configured to pass magnetic flux based on a movement of a lens module. The AD converter is configured to output a digital value based on a voltage difference between a first output terminal and a second output terminal of the Hall sensor. The driver is configured to generate a driving signal to control the movement of the lens module based on the digital value. The voltage-current conversion circuit is configured to generate a current configured to decrease when a voltage of an input terminal to which a bias current of the Hall sensor is input increases and increase when the voltage of the input terminal decreases. The current mirror circuit has a current mirror structure configured to feedback the bias current based on the current generated by the voltage-current conversion circuit.

The voltage-current conversion circuit may include a conversion transistor configured to flow the current generated by the voltage-current conversion circuit between a drain terminal and a source terminal of the conversion transistor. The current mirror circuit may inclulde a feedback resistor configured to flow the current generated by the voltage-current conversion circuit.

The current mirror circuit may include a first feedback input transistor and a second feedback input transistor, and a first feedback output transistor and a second feedback output transistor. The first feedback input transistor and the second feedback input transistor may each be configured to flow a current generated by the voltage-current conversion circuit, respectively, between a source terminal and a drain terminal, and connected to each other in series. The first feedback output transistor and the second feedback output transistor may each be configured to flow the bias current, respectively, between a source terminal and a drain terminal, and connected to each other in series. The feedback resistor may be connected between a gate terminal of the first feedback input transistor and a gate terminal of the second feedback input transistor.

The voltage-current conversion circuit ay further include a buffer configured to invert a voltage of an input terminal of the Hall sensor and output a voltage corresponding to the voltage of the input terminal of the Hall sensor, and a conversion resistor connected between the conversion transistor and a ground. The conversion transistor may be configured to generate a current configured to increase when a voltage output from the buffer increases and decrease when a voltage output from the buffer decreases.

The apparatus may further include an amplifier configured to amplify a voltage difference between the first and second output terminals of the Hall sensor. The AD converter may be configured to output the digital value based on an output voltage of the amplifier.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1A:
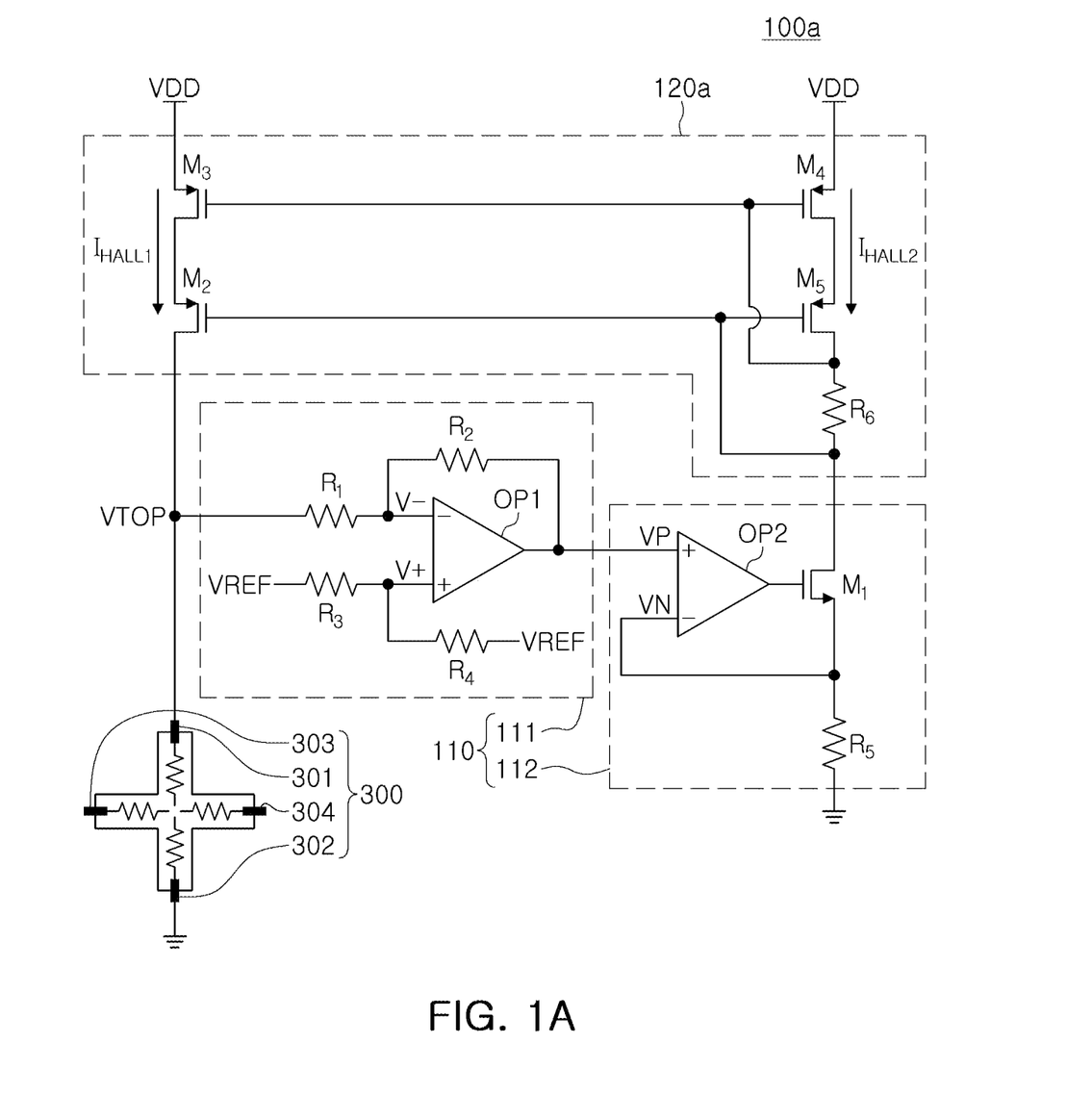
FIGS. 1A and 1B are views illustrating examples of an apparatus for reducing an offset of a Hall sensor.
Figure 1B:
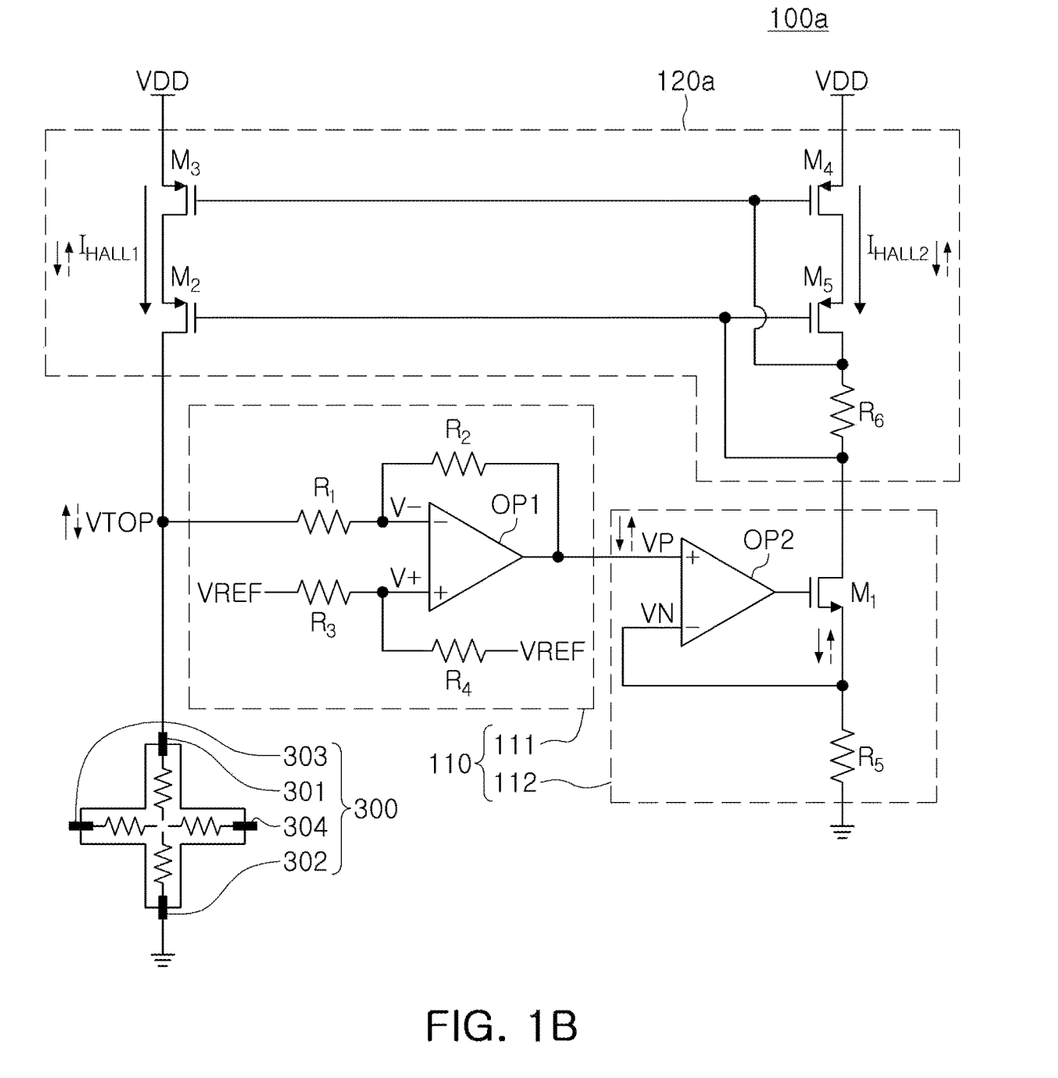

FIGS. 1A and 1B are views illustrating examples of an apparatus for reducing an offset of a Hall sensor.

Referring to FIG. 1A, a Hall sensor 300 may receive a bias current $I_{HALL1}$ through an input terminal 301. The bias current $I_{HALL1}$ passing through the Hall sensor 300 may flow to the ground through a ground terminal 302 of the Hall sensor 300.

The Hall sensor 300 may sense magnetic flux passing through the Hall sensor 300 by using a Hall effect. When magnetic flux passes through the Hall sensor 300, the Hall sensor 300 may generate a bias current $I_{HALL1}$ and a Hall voltage in a direction, perpendicular to the magnetic flux, and a voltage difference between a first output voltage of a first output terminal 303 and a second output voltage of a second output terminal 304 may correspond to the Hall voltage. Accordingly, the voltage difference between the first and second output terminals 303 and 304 may be used as a measurement value for the magnetic flux passing through the Hall sensor 300. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

An equivalent circuit of the Hall sensor 300 may be composed of a plurality of resistors. Resistance values of the plurality of resistors may vary due to external factors of the Hall sensor 300, such as temperature.

For example, the voltage of each of the first and second output terminals 303 and 304 may increase together when the resistance values of the plurality of resistors increase, and when the resistance values of the plurality of resistors decrease, the voltage of each of the first and second output terminals 303 and 304 may decrease together.

A common voltage change value of the first and second output terminals 303 and 304 according to external factors of the Hall sensor 300, such as a temperature, may be defined as an offset of the Hall sensor 300.

Since the voltage difference between the first and second output terminals 303 and 304 compared to unit magnetic flux passing through the Hall sensor 300 may be proportional to the voltages of the first and second output terminals 303 and 304, an offset of the Hall sensor 300 may affect a voltage difference between the first and second output terminals 303 and 304 compared to the unit magnetic flux passing through the Hall sensor 300.

That is, the voltage difference between the first and second output terminals 303 and 304 compared to the unit magnetic flux passing through the Hall sensor 300 may vary depending on the magnetic flux and an offset passing through the Hall sensor 300.

Therefore, from the viewpoint of extracting magnetic flux information passing through the Hall sensor 300 from the voltage difference between the first and second output terminals 303 and 304, an effect of an offset may be determined as a part of the magnetic flux information passing through the Hall sensor 300, and accuracy of the extracted magnetic flux information may be lowered.

An apparatus for reducing an offset of a Hall sensor 100a according to one or more embodiments of the present disclosure may reduce an offset of the Hall sensor 300. For example, the apparatus for reducing an offset of a Hall sensor 100a may be implemented as an integrated circuit (IC), may be mounted on a substrate such as a printed circuit board, and may be electrically connected to the Hall sensor 300 through the substrate.

Referring to FIG. 1A, the apparatus for reducing an offset of a Hall sensor 100a according to one or more embodiments of the present disclosure may include a voltage-current conversion circuit 110 and a current mirror circuit 120a.

The voltage-current conversion circuit 110 may be configured to generate a current $I_{HALL2}$ decreasing when the voltage VTOP of the input terminal 310, to which the bias current $I_{HALL1}$ is input, increases and increasing when the voltage VTOP of the input terminal 301 decreases.

The current mirror circuit 120a may be configured to feedback the bias current $I_{HALL1}$ based on the current $I_{HALL2}$ generated by the voltage-current conversion circuit 110 by a current mirror structure.

Accordingly, the bias current $I_{HALL1}$ of the Hall sensor 300 may decrease when the voltage VTOP of the input terminal 301 increases, and may increase when the voltage VTOP of the input terminal 301 decreases.

That is, the voltage VTOP of the input terminal 301 may increase as the resistance value of the Hall sensor 300 increases, and may decrease when the bias current $I_{HALL1}$ decreases. The voltage VTOP of the input terminal 301 may decrease as the resistance value of the Hall sensor 300 decreases, and may increase when the bias current $I_{HALL1}$ increases.

The apparatus for reducing an offset of a Hall sensor 100a according to one or more embodiments of the present disclosure may have a structure in which a start and an end of a process of reducing an offset of the Hall sensor 300 is a bias current $I_{HALL1}$ or an input terminal 301, so the efficiency, accuracy, and stability of the process can be improved overall.

The current mirror circuit 120a may include feedback input transistors $M_4$ and $M_5$ configured such that the current $I_{HALL2}$ generated by the voltage-current conversion circuit 110 flows between a source terminal and a drain terminal, and may include feedback output transistors $M_2$ and $M_3$ configured such that the bias current $I_{HALL1}$ flows between the source terminal and the drain terminal.

The current mirror circuit 120a may mirror through gate terminals of the feedback input transistors $M_4$ and $M_5$ and gate terminals of the feedback output transistors $M_2$ and $M_3$. For example, a voltage of the gate terminals of the feedback input transistors $M_4$ and $M_5$ and a voltage of the gate terminals of the feedback output transistors $M_2$ and $M_3$ may be shared with each other, and the gate terminals of the feedback input transistors $M_4$ and $M_5$ may be electrically connected to drain terminals of the feedback input transistors $M_4$ and $M_5$.

Accordingly, the magnitude of the bias current $I_{HALL1}$ may be determined to be proportional to the current $I_{HALL2}$ generated by the voltage-current conversion circuit 110 at a preset ratio (e.g., a one to one (1:1) ratio). Here, the preset ratio may be determined based on a W/L of the feedback input transistors $M_4$ and $M_5$ and a W/L of the feedback output transistors $M_2$ and $M_3$.

In addition, since an influence of external factors (e.g., temperature) of the feedback input transistors $M_4$ and $M_5$ and an influence of external factors of the feedback output transistors $M_2$ and $M_3$ may be common to each other, a ratio (e.g., 1 to 1) between the current $I_{HALL2}$ generated by the voltage-current conversion circuit 110 and the bias current $I_{HALL1}$ may not be substantially affected by external factors.

Therefore, the apparatus for reducing an offset of a Hall sensor 100a according to one or more embodiments of the present disclosure may more stably reduce an offset of the Hall sensor 300.

For example, the feedback input transistors $M_4$ and $M_5$ may include a first feedback input transistor $M_5$ and a second feedback input transistor $M_4$ connected to each other in series. For example, the feedback output transistors $M_2$ and $M_3$ may include a first feedback output transistor $M_2$ and a second feedback output transistor $M_3$ connected to each other in series.

The first and second feedback input transistors $M_5$ and $M_4$ may be mirrored in parallel to the first and second feedback output transistors $M_2$ and $M_3$. That is, the voltage of the gate terminal of the first feedback input transistor $M_5$ and the voltage of the gate terminal of the first feedback output transistor $M_2$ may be shared with each other, and the voltage of the gate terminal of the second feedback input transistor $M_4$ and the voltage of the second feedback output transistor $M_3$ may be shared with each other, but the voltage of the gate terminal of the first feedback input transistor $M_5$ and the voltage of the gate terminal of the second feedback output transistor $M_3$ may be separated from each other, and the voltage of the gate terminal of the second feedback input transistor $M_4$ and the voltage of the gate terminal of the first feedback output transistor $M_2$ may be separated from each other.

Accordingly, the current mirror circuit 120a may more stably mirror the current $I_{HALL2}$ generated by the voltage-current conversion circuit 110 to feedback the bias current $I_{HALL1}$, and may further widen a range of an offset of the Hall sensor 300 that can be decreased.

The current mirror circuit 120a may be disposed so that the current $I_{HALL2}$ generated by the voltage-current conversion circuit 110 flows, and may further include a feedback resistor $R_6$ electrically connected between the gate terminal of the first feedback input transistor $M_5$ and the gate terminal of the second feedback input transistor $M_4$.

That is, the feedback resistor $R_6$ may form a bias voltage of a path through which the current $I_{HALL2}$ generated by the voltage-current conversion circuit 110 flows, and may also form a difference voltage between the voltage of the gate terminal of the first feedback input transistor $M_5$ and the voltage of the gate terminal of the second feedback input transistor $M_4$.

The feedback resistor $R_6$ may be electrically connected between the feedback input transistors $M_4$ and $M_5$ and the conversion transistor $M_1$, and may form a bias voltage of a path through which the current $I_{HALL2}$ generated by the voltage-current conversion circuit 110 flows.

The voltage-current conversion circuit 110 may include a buffer 111 and a conversion core circuit 112, and the conversion core circuit 112 may include at least one of a conversion transistor $M_1$, a conversion resistor $R_5$, and a conversion operational amplifier OP2.

The conversion transistor $M_1$ may be configured such that the current $I_{HALL2}$ generated by the voltage-current conversion circuit 110 flows between the drain terminal and the source terminal.

Since the conversion transistor $M_1$ may generate the current $I_{HALL2}$ based on the voltage of the gate terminal, a voltage-current conversion operation may be performed.

The conversion resistor $R_5$ may be electrically connected between the conversion transistor $M_1$ and ground. Accordingly, the stability of the bias voltage of the conversion transistor $M_1$ may be improved.

The conversion operational amplifier OP2 may have a structure in which an output terminal is electrically connected to the gate terminal of the conversion transistor $M_1$, a voltage corresponding to the voltage VTOP of the input terminal 301 of the Hall sensor is input to one of a plurality of input terminals, and a node between the conversion transistor $M_1$ and the conversion resistor $R_5$ is electrically connected to the other one of the plurality of input terminals. Accordingly, the voltage-current conversion circuit 110 may perform a voltage-current conversion operation more stably.

For example, when a positive input voltage VP of the conversion operational amplifier OP2 increases, a voltage of the gate terminal of the conversion transistor $M_1$ may increase, and a current between the drain terminal and the source terminal of the conversion transistor $M_1$ may increase, and a negative input voltage VN of the conversion operational amplifier OP2 may increase as the current flowing through the conversion resistor $R_5$ increases.

For example, when the positive input voltage VP of the conversion operational amplifier OP2 decreases, the voltage of the gate terminal of the conversion transistor $M_1$ may decrease, and a current between the drain terminal and the source terminal of the conversion transistor $M_1$ may decrease, and a negative input voltage VN of the conversion operational amplifier OP2 may decrease as the current flowing through the conversion resistor $R_5$ decreases.

That is, the conversion transistor $M_1$ may generate a current $I_{HALL2}$ that increases when the voltage output from the buffer 111 increases and decreases when the voltage output from the buffer 111 decreases.

The buffer 111 may invert the voltage VTOP of the input terminal 301 of the Hall sensor 300 and output a positive input voltage VP corresponding to the voltage VTOP to a conversion operational amplifier OP2.

Since the buffer 111 may have an input impedance higher than the output impedance of the buffer 111, the influence of the voltage-current conversion circuit 110 on the voltage VTOP may be reduced.

For example, the buffer 111 may include at least one of a buffer operational amplifier OP1, a first resistor $R_1$, a second resistor $R_2$, a third resistor $R_3$, and a fourth resistor $R_4$.

The first resistor $R_1$ may be electrically connected between one of the plurality of input terminals of the buffer operational amplifier OP1 and the input terminal 301 of the Hall sensor 300.

The second resistor $R_2$ may be electrically connected between one of the plurality of input terminals of the buffer operational amplifier OP1 and the output terminal of the buffer operational amplifier OP1.

The third and fourth resistors $R_3$ and $R_4$ may be electrically connected to the other one of the plurality of input terminals of the buffer operational amplifier OP1.

That is, since the buffer 111 may have an inverting amplifier structure, the voltage VTOP of the input terminal 301 of the Hall sensor 300 may be inverted, and the voltage VTOP of the input terminal 301 may be amplified by a gain based on the relationship between resistance values of the first, second, third, and fourth resistors $R_1$, $R_2$, $R_3$, and $R_4$.

For example, the buffer 111 may be configured to apply a reference voltage VREF different from the ground voltage to the third and fourth resistors $R_3$ and $R_4$. Accordingly, the positive input voltage VP of the conversion operational amplifier OP2 can be easily set, and the current $I_{HALL2}$ of the conversion transistor $M_1$ can be easily adjusted. For example, according to the control of the reference voltage VREF, the on-off of the conversion transistor $M_1$ may be controlled, and on-off of the apparatus for reducing an offset of the Hall sensor 100a according to one or more embodiments of the present disclosure may be controlled.

Referring to FIG. 1B, when the voltage VTOP of the input terminal 301 of the Hall sensor 300 increases/decreases, the positive input voltage VP of the conversion operational amplifier OP2 may decrease/increase, the current of the conversion transistor $M_1$ can be decreased/increased, the current $I_{HALL2}$ of the feedback input transistors $M_4$ and $M_5$ can be decreased/increased, and the current $I_{HALL1}$ of the feedback output transistors $M_2$ and $M_3$ can be decreased/increased.

That is, the bias current $I_{HALL1}$ of the Hall sensor 300 decreases when the voltage VTOP of the input terminal 301 increases, and may increase when the voltage VTOP of the input terminal 301 decreases.

Figure 2A:
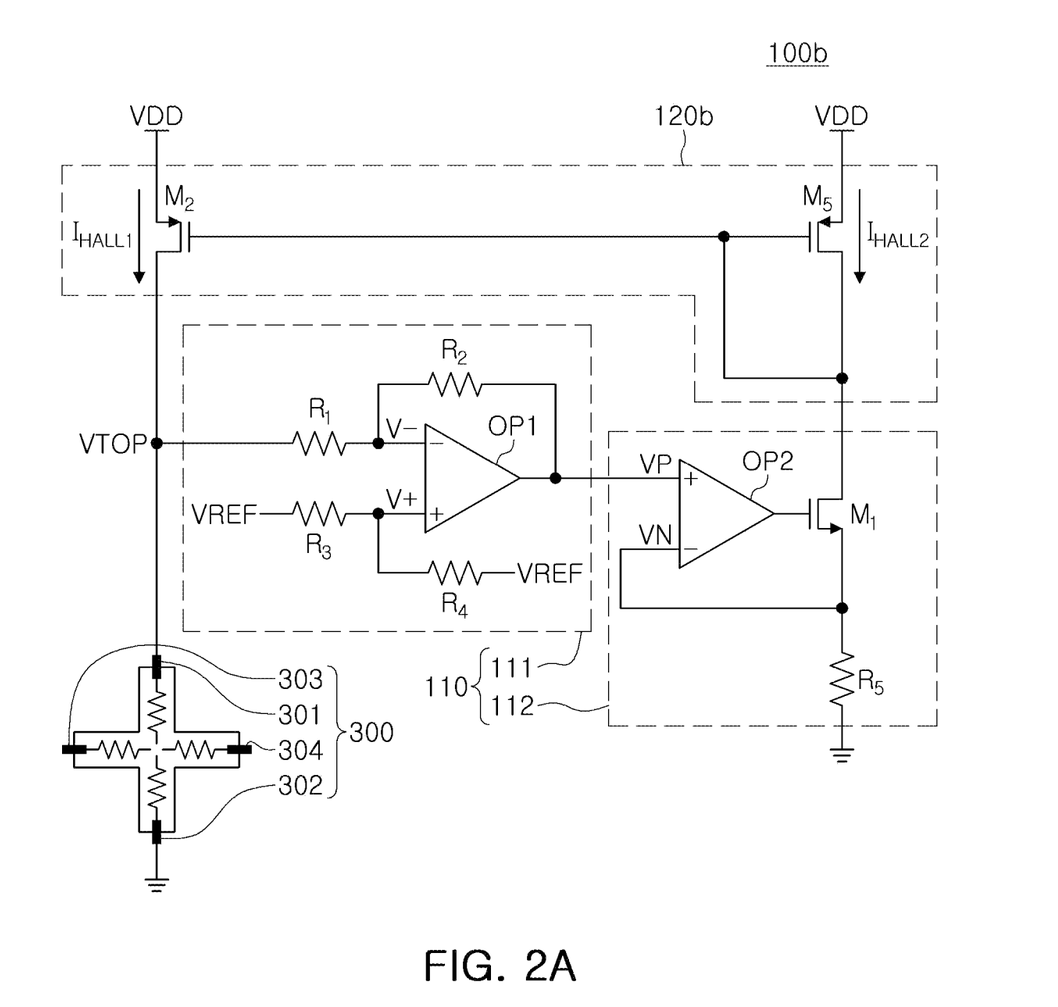
FIGS. 2A and 2B are diagrams illustrating examples of a modified structure of a current mirror circuit of an apparatus for reducing an offset of a Hall sensor.
Figure 2B:
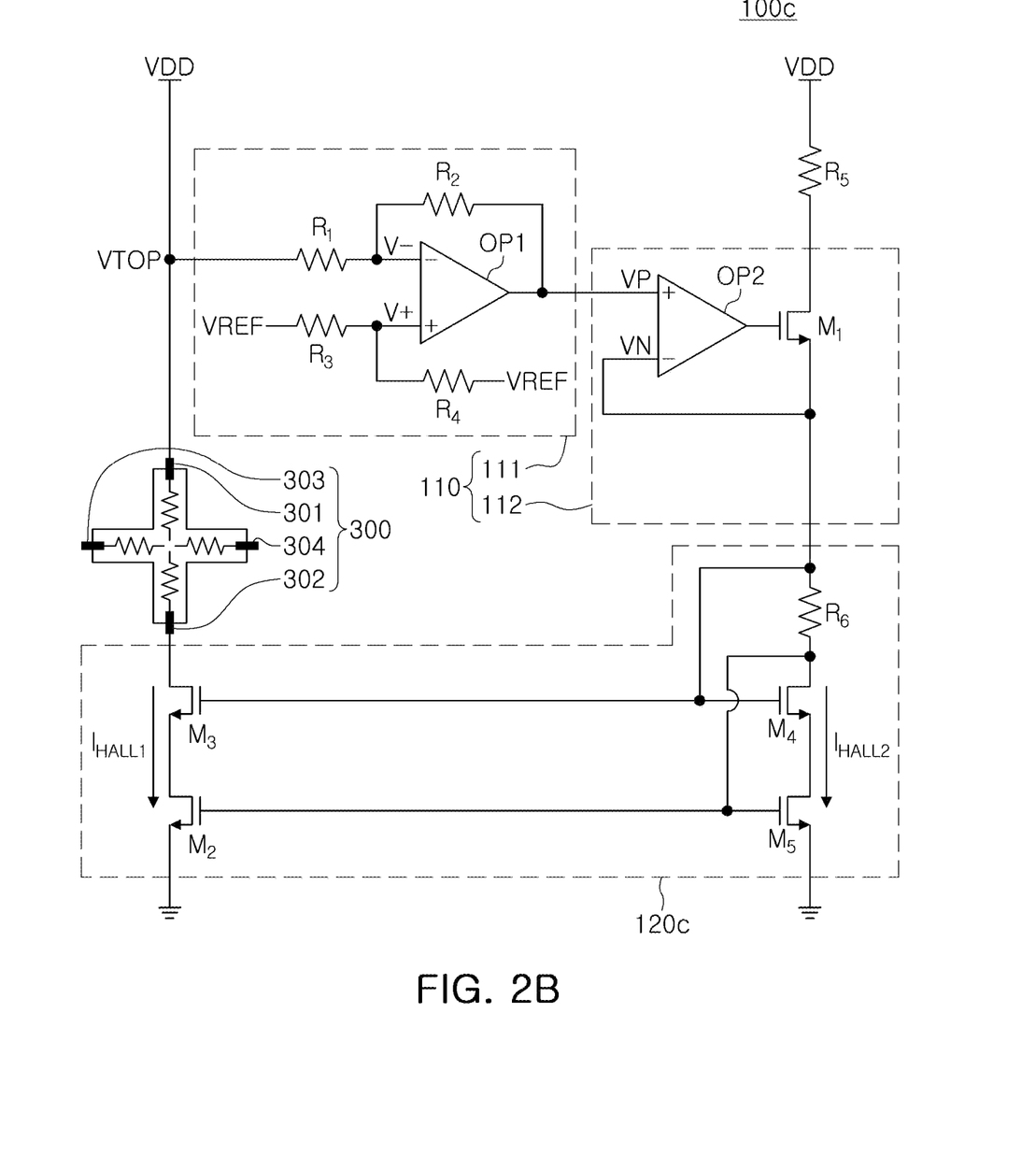

FIGS. 2A and 2B are diagrams illustrating examples of a modified structure of a current mirror circuit of an apparatus for reducing an offset of a Hall sensor.

Referring to FIG. 2A, the feedback input transistor $M_5$ and the feedback output transistor $M_2$ of a current mirror circuit 120b of an apparatus for reducing an offset of a Hall sensor 100b according to one or more embodiments of the present disclosure may be one, respectively. Here, the feedback resistor shown in FIG. 1A may be omitted. The number of the feedback input transistor $M_5$ and the feedback output transistor $M_2$ may be determined based on a threshold voltage of the feedback input transistor $M_5$ and the feedback output transistor $M_2$ and a power supply VDD.

Referring to FIG. 2B, since the current mirror circuit 120c of the apparatus for reducing an offset of a Hall sensor 100c according to one or more embodiments of the present disclosure may be implemented as an NMOS, and it may be a different type from the PMOS of the current mirror circuit shown in FIG. 1A.

Figure 3:
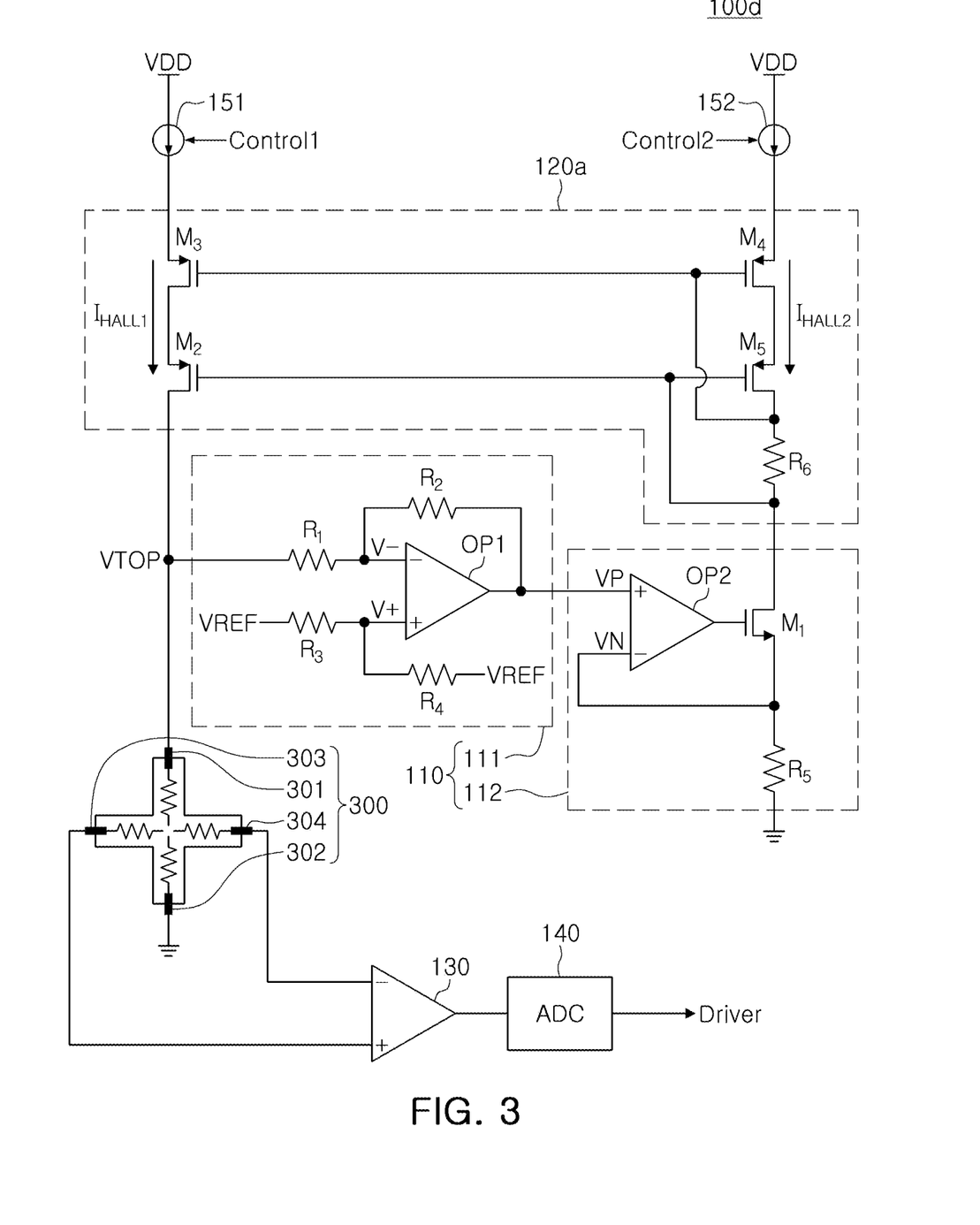
FIGS. 3 and 4 are views showing examples of an apparatus for reducing an offset of a Hall sensor and an apparatus for controlling a lens module.
Figure 4:
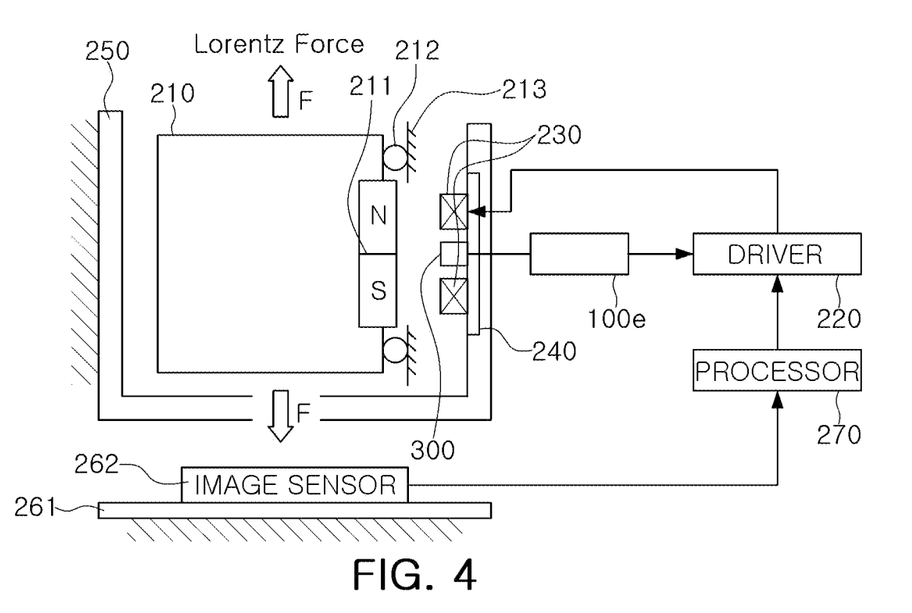

FIGS. 3 and 4 are views illustrating examples of an apparatus for reducing an offset of a Hall sensor and an apparatus for controlling a lens module.

Referring to FIG. 3, an apparatus for controlling a lens module 100d according to one or more embodiments of the present disclosure may include the apparatus for reducing an offset of a Hall sensor shown in FIG. 1A, and may include at least one of first and second current sources 151 and 152.

The first and second current sources 151 and 152 may generate a bias current $I_{HALL1}$ and a current $I_{HALL2}$ of the feedback input transistors $M_4$ and $M_5$, respectively. For example, the first and second current sources 151 and 152 may receive first and second control signals (control 1 and control 2), and may generate a bias current $I_{HALL1}$ and a current $I_{HALL2}$ that the magnitudes thereof are determined based on the first and second control signals (control 1 and control 2).

Referring to FIG. 3, at least one of a Hall sensor 300, an amplifier 130, an analog-to-digital (AD) converter 140, and a driver may be included in the apparatus for controlling a lens module 100d.

The amplifier 130 may amplify a voltage difference between the first and second output terminals 303 and 304 of the Hall sensor 300. For example, the amplifier 130 may be implemented as a (non) inverting amplifier circuit in which an operational amplifier and a plurality of resistors are combined, and may generate a voltage amplified in proportion to the voltage difference between the first and second output terminals 303 and 304.

A gain of the amplifier 130 may be determined according to a relationship between resistance values of the plurality of resistors. The amplifier 130 having a low gain may be advantageous when a wide magnetic flux sensing range of the Hall sensor 300 is required, and the amplifier 130 having a high gain may be advantageous when a high magnetic flux sensing resolution of the Hall sensor 300 is required.

The AD converter 140 may output a digital value based on an analog value corresponding to the voltage difference between the first and second output terminals 301 and 302 of the Hall sensor 300 or to the output voltage of the amplifier 130.

The driver may generate a driving signal to control the movement of the lens module based on the digital value output from the AD converter 140.

Referring to FIG. 4, an apparatus for controlling a lens module 100e according to one or more embodiments of the present disclosure may include an apparatus for reducing an offset of a Hall sensor, and may be electrically connected to the Hall sensor 300.

The Hall sensor 300 may be disposed so that magnetic flux based on the movement of the lens module 210 passes.

The driver 220 may receive an output value of the apparatus for controlling a lens module 100e corresponding to magnetic flux information passing through the Hall sensor 300, and may generate positional information of the lens module 210 through the magnetic flux information.

For example, the driver 220 may be included in the apparatus for controlling a lens module 100e or may be implemented as a separate integrated circuit for the apparatus for controlling a lens module 100e.

The driver 220 may include an optical image stabilization (OIS) control structure, may determine the magnitude of a driving current based on the magnetic flux information, and output a driving signal including the determined driving current to the driving coil 230.

The driving coil 230 may generate magnetic flux based on a driving current included in the driving signal, and may be disposed near the magnetic member 211 of the lens module 210. For example, the driving coil 230 and the Hall sensor 300 may be disposed on the first substrate 240.

The lens module 210 may move according to force received by the magnetic member 211 in response to the magnetic flux of the driving coil 230. In this case, the lens module 210 may move to change the magnetic flux in a direction opposite to the change of the magnetic flux passing through the Hall sensor 300. Accordingly, an absolute position of the lens module 210 may be substantially fixed, and an image obtained by the lens module 210 may be stable.

Meanwhile, the processor 270 may be implemented as an image signal processor (ISP), receive image information from the image sensor 262 on the first support member 261, and transmit the processed information to the driver 220.

The lens module 210 may move one-dimensionally or two-dimensionally, according to the rotation of the plurality of guide balls 212 on the second support member 213, and may be surrounded by the housing 250.

A structure including most of the lens module, peripheral components of the lens module 210, and the housing 250 may be defined as a camera module.

Figure 5:
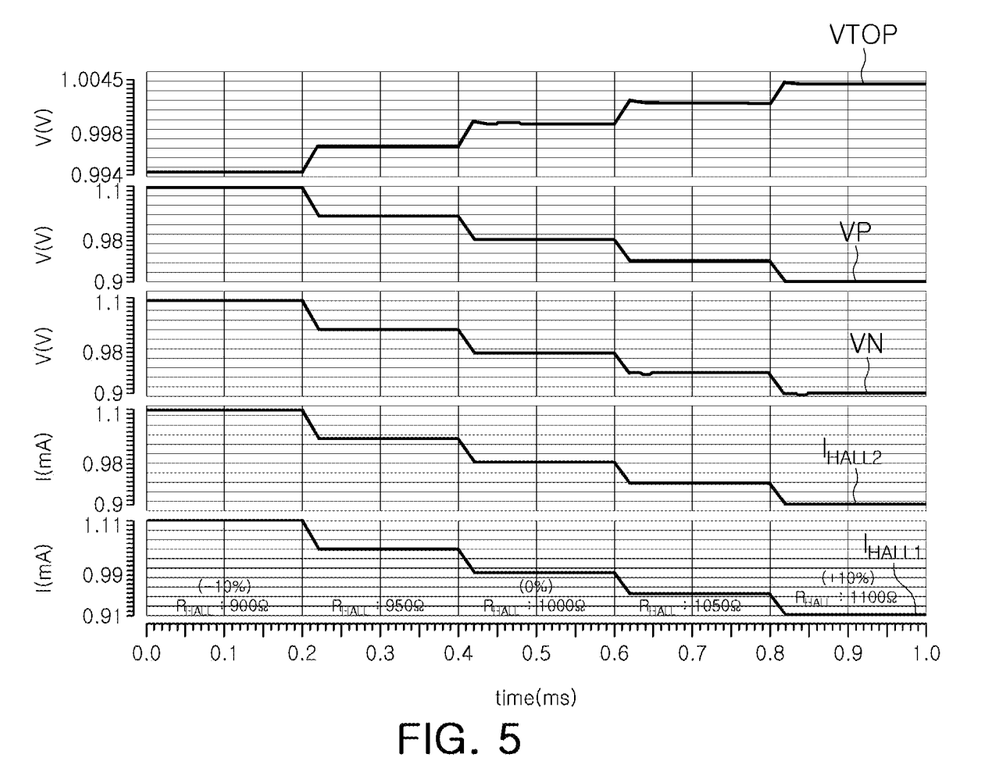
FIG. 5 is a graph showing an example of the main voltage/current of an apparatus for reducing an offset of a Hall sensor and an apparatus for controlling a lens module.

FIG. 5 is a graph showing an example of a main voltage/current of the apparatus for reducing an offset of a Hall sensor and the apparatus for controlling a lens module.

Referring to FIG. 5, a resistance value $R_{HALL}$ of the Hall sensor may be set to increase from 900 ohms to 1100 ohms step by step for a time of 1 ms. That is, the resistance value $R_{HALL}$ of the Hall sensor may be set to increase from 90% of 1000 ohms to 110% of 1000 ohms.

A voltage VTOP of the input terminal of the Hall sensor may increase as the resistance value $R_{HALL}$ increases, and a positive input voltage VP and a negative input voltage VN of the conversion operational amplifier can decrease, and a current $I_{HALL2}$ of the feedback input transistor may decrease, and a current $I_{HALL1}$ of the feedback output transistor may decrease.

The voltage VTOP of the input terminal of the Hall sensor may be a voltage of about 99.47% of 1V when the resistance value $R_{HALL}$ of the Hall sensor is 90% of 1000 ohms, and when the resistance value $R_{HALL}$ of the Hall sensor is 110% of 1000 ohms, it may be a voltage of about 100.43% of 1V.

In other words, the change in the voltage VTOP of the input terminal of the Hall sensor can be very small compared to the change in the resistance value $R_{HALL}$ of the Hall sensor, and the change in the voltage VTOP of the input terminal of the Hall sensor may correspond to an offset of the Hall sensor, such that the apparatus for reducing an offset of a Hall sensor and the apparatus for controlling a lens module according to one or more embodiments of the present disclosure may effectively reduce an offset of the Hall sensor.

As set forth above, according to one or more embodiments of the present disclosure, since an apparatus for reducing an offset of a Hall sensor and an apparatus for controlling a lens module may have a structure in which a start and an end of a process of reducing an offset of a Hall sensor is a bias current, efficiency, accuracy and stability of the process may be improved overall.

Since the apparatus for reducing an offset of a Hall sensor and the apparatus for controlling a lens module can self-reduce an offset without an external element (e.g., temperature) sensing structure (e.g., a temperature sensor, a Hall sensor to be compared), it can be more easily simplified/miniaturized.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus configured to reduce an offset of a Hall sensor, comprising:
   a voltage-current conversion circuit configured to generate a current configured to decrease when a voltage of an input terminal to which a bias current of a Hall sensor is input increases and increase when the voltage of the input terminal decreases; and
   a current mirror circuit having a current mirror structure configured to feedback the bias current based on the current generated by the voltage-current conversion circuit,
   wherein the current mirror circuit comprises
   a feedback input transistor configured to flow the current generated by the voltage-current conversion circuit between a source terminal and a drain terminal of the feedback input transistor, and
   a feedback output transistor configured to flow the bias current between a source terminal and a drain terminal of the feedback output transistor,
   wherein the current minor circuit is configured to mirror the current generated by the voltage-current conversion circuit through a gate terminal of the feedback input transistor and a gate terminal of the feedback output transistor,
   wherein the voltage-current conversion circuit comprises a conversion transistor configured to flow the current generated by the voltage-current conversion circuit between a drain terminal and a source terminal of the conversion transistor, and
   wherein the current mirror circuit further comprises a feedback resistor connected between the feedback input transistor and the conversion transistor.

2. The apparatus of claim 1, wherein the feedback input transistor comprises a first feedback input transistor and a second feedback input transistor connected to each other in series,
   the feedback output transistor comprises a first feedback output transistor and a second feedback output transistor connected to each other in series, and
   the first and second feedback input transistors mirror the current generated by the voltage-current conversion circuit to the first and second feedback output transistors in parallel.

3. The apparatus of claim 2, wherein the feedback resistor is connected between a gate terminal of the first feedback input transistor and a gate terminal of the second feedback input transistor.

4. The apparatus of claim 1, wherein the voltage-current conversion circuit further comprises a conversion resistor connected between the conversion transistor and a ground.

5. The apparatus of claim 4, further comprising a conversion operational amplifier having an output terminal connected to a gate terminal of the conversion transistor, receiving a voltage corresponding to a voltage of an input terminal of the hall sensor to one of a plurality of input terminals of the conversion operational amplifier and to a node between the conversion transistor and the conversion resistor through another one of the plurality of input terminals of the conversion operational amplifier.

6. The apparatus of claim 5, wherein the voltage-current conversion circuit further comprises a buffer configured to invert the voltage of the input terminal of the hall sensor and output a voltage corresponding to the voltage of the input terminal of the hall sensor to the conversion operational amplifier.

7. The apparatus of claim 1, wherein the voltage-current conversion circuit further comprises
a buffer configured to invert a voltage of the input terminal of the Hall sensor and output a voltage corresponding to the voltage of the input terminal of the Hall sensor, and
wherein the conversion transistor is configured to generate a current configured to increase when a voltage output from the buffer increases and decrease when a voltage output from the buffer decreases.

8. The apparatus of claim 7, wherein the buffer comprises:
a buffer operational amplifier;
a first resistor connected between one of a plurality of input terminals of the buffer operational amplifier and an input terminal of the Hall sensor;
a second resistor connected between one of the plurality of input terminals of the buffer operational amplifier and an output terminal of the buffer operational amplifier; and
third and fourth resistors connected to another of the plurality of input terminals of the buffer operational amplifier.

9. The apparatus of claim 8, wherein the buffer is configured to apply a reference voltage, different from a ground voltage, to the third and fourth resistors.

10. An apparatus configured to control a lens module, comprising:
a Hall sensor configured to pass magnetic flux based on a movement of a lens module;
an analog-to-digital (AD) converter configured to output a digital value based on a voltage difference between a first output terminal and a second output terminal of the Hall sensor;
a driver configured to generate a driving signal to control the movement of the lens module based on the digital value;
a voltage-current conversion circuit configured to generate a current configured to decrease when a voltage of an input terminal to which a bias current of the Hall sensor is input increases and increase when the voltage of the input terminal decreases; and
a current mirror circuit having a current mirror structure configured to feedback the bias current based on the current generated by the voltage-current conversion circuit.

11. The apparatus of claim 10, wherein the voltage-current conversion circuit comprises
a conversion transistor configured to flow the current generated by the voltage-current conversion circuit between a drain terminal and a source terminal of the conversion transistor, and
wherein the current mirror circuit comprises a feedback resistor configured to flow the current generated by the voltage-current conversion circuit.

12. The apparatus of claim 11, wherein the current mirror circuit comprises:
a first feedback input transistor and a second feedback input transistor each configured to flow a current generated by the voltage-current conversion circuit, respectively, between a source terminal and a drain terminal, and connected to each other in series; and
a first feedback output transistor and a second feedback output transistor each configured to flow the bias current, respectively, between a source terminal and a drain terminal, and connected to each other in series, and
wherein the feedback resistor is connected between a gate terminal of the first feedback input transistor and a gate terminal of the second feedback input transistor.

13. The apparatus of claim 11, wherein the voltage-current conversion circuit further comprises a buffer configured to invert a voltage of an input terminal of the Hall sensor and output a voltage corresponding to the voltage of the input terminal of the Hall sensor; and
a conversion resistor connected between the conversion transistor and a ground, and
wherein the conversion transistor is configured to generate a current configured to increase when a voltage output from the buffer increases and decrease when a voltage output from the buffer decreases.

14. The apparatus of claim 10, further comprising
an amplifier configured to amplify a voltage difference between the first and second output terminals of the Hall sensor,
wherein the AD converter is configured to output the digital value based on an output voltage of the amplifier.

15. An apparatus configured to reduce an offset of a Hall sensor, comprising:
a voltage-current conversion circuit configured to generate a current configured to decrease when a voltage of an input terminal to which a bias current of a Hall sensor is input increases and increase when the voltage of the input terminal decreases; and
a current mirror circuit having a current mirror structure configured to feedback the bias current based on the current generated by the voltage-current conversion circuit,
wherein the voltage-current conversion circuit comprises
a conversion transistor configured to flow the current generated by the voltage-current conversion circuit between a drain terminal and a source terminal of the conversion transistor, and
a buffer configured to invert a voltage of the input terminal of the Hall sensor and output a voltage corresponding to the voltage of the input terminal of the Hall sensor,
wherein the conversion transistor is configured to generate a current configured to increase when a voltage output from the buffer increases and decrease when a voltage output from the buffer decreases, and
wherein the buffer comprises:
a buffer operational amplifier;
a first resistor connected between one of a plurality of input terminals of the buffer operational amplifier and an input terminal of the Hall sensor;
a second resistor connected between one of the plurality of input terminals of the buffer operational amplifier and an output terminal of the buffer operational amplifier; and
third and fourth resistors connected to another of the plurality of input terminals of the buffer operational amplifier.

16. The apparatus of claim 15, wherein the buffer is configured to apply a reference voltage, different from a ground voltage, to the third and fourth resistors.

17. The apparatus of claim 15, wherein the current mirror circuit comprises
a feedback input transistor configured to flow the current generated by the voltage-current conversion circuit between a source terminal and a drain terminal of the feedback input transistor, and a feedback output transistor configured to flow the bias current between a source terminal and a drain terminal of the feedback output transistor, and wherein the current mirror circuit is configured to mirror the current generated by the voltage-current conversion circuit through a gate terminal of the feedback input transistor and a gate terminal of the feedback output transistor.

* * * * *